US012721058B2

(12) United States Patent
Wada et al.

(10) Patent No.: US 12,721,058 B2
(45) Date of Patent: Aug. 25, 2026

(54) SUBSTRATE PROCESSING METHOD AND SUBSTRATE PROCESSING APPARATUS

(71) Applicant: Tokyo Electron Limited, Tokyo (JP)

(72) Inventors: Makoto Wada, Nirasaki City (JP); Takashi Matsumoto, Nirasaki City (JP); Ryota Ifuku, Nirasaki City (JP); Hiroki Yamada, Nirasaki City (JP); Haruhiko Furuya, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 879 days.

(21) Appl. No.: 17/931,930

(22) Filed: Sep. 14, 2022

(65) Prior Publication Data

US 2023/0080956 A1 Mar. 16, 2023

(30) Foreign Application Priority Data

Sep. 16, 2021 (JP) ................................ 2021-151289

(51) Int. Cl.
*H01L 21/3205* (2006.01)
*C01B 32/182* (2017.01)
(Continued)

(52) U.S. Cl.
CPC .......... *H10P 14/416* (2026.01); *C01B 32/182* (2017.08); *C01B 32/186* (2017.08);
(Continued)

(58) Field of Classification Search
CPC ................................ C23C 16/26; C23C 16/56
See application file for complete search history.

(56) References Cited

U.S. PATENT DOCUMENTS

| | | | | |
|---|---|---|---|---|
| 2004/0137750 A1* | 7/2004 | Nemoto | .................. | H10P 70/12 438/719 |
| 2007/0015319 A1* | 1/2007 | Chin | ...................... | H10D 86/60 257/E21.32 |

(Continued)

FOREIGN PATENT DOCUMENTS

| | | |
|---|---|---|
| CN | 109502575 A | 3/2019 |
| CN | 109852944 A | 6/2019 |

(Continued)

OTHER PUBLICATIONS

Chen et al., "Oxygen-Aided Synthesis of Polycrystalline Graphene on Silicon Dioxide Substrates", JACS, 2011, vol. 133, pp. 17548-17551.

(Continued)

*Primary Examiner* — Dah-Wei D. Yuan
*Assistant Examiner* — Kristen A Dagenais
(74) *Attorney, Agent, or Firm* — Armstrong Teasdale LLP

(57) ABSTRACT

A substrate processing method includes: a carry-in step of carrying a substrate having a silicon-containing film on a surface of the substrate into a processing container; a first step of forming an adsorption layer by supplying an oxygen-containing gas into the processing container and causing the oxygen-containing gas to be adsorbed on a surface of the silicon-containing film; a second step of forming a silicon oxide layer by supplying an argon-containing gas into the processing container and causing the adsorption layer and the surface of the silicon-containing film to react with each other with plasma of the argon-containing gas; and a third step of forming a graphene film on the silicon oxide layer by supplying a carbon-containing gas into the processing container with plasma of the carbon-containing gas.

16 Claims, 8 Drawing Sheets

(51) Int. Cl.

| | |
|---|---|
| ***C01B 32/186*** | (2017.01) |
| ***C23C 16/02*** | (2006.01) |
| ***C23C 16/26*** | (2006.01) |
| ***C23C 16/56*** | (2006.01) |
| ***H01L 21/3213*** | (2006.01) |
| ***H10P 14/20*** | (2026.01) |
| ***H10P 14/24*** | (2026.01) |
| ***H10P 14/40*** | (2026.01) |
| ***H10P 14/60*** | (2026.01) |
| ***H10P 14/692*** | (2026.01) |
| ***H10P 50/26*** | (2026.01) |
| ***H10P 72/00*** | (2026.01) |
| ***H10P 72/30*** | (2026.01) |
| ***H10P 95/00*** | (2026.01) |
| *H10P 14/69* | (2026.01) |

(52) U.S. Cl.

CPC .......... *C23C 16/0272* (2013.01); *C23C 16/26* (2013.01); *C23C 16/56* (2013.01); *H10P 14/24* (2026.01); *H10P 14/3406* (2026.01); *H10P 14/6309* (2026.01); *H10P 14/6319* (2026.01); *H10P 14/6336* (2026.01); *H10P 14/6506* (2026.01); *H10P 14/6519* (2026.01); *H10P 14/69215* (2026.01); *H10P 50/267* (2026.01); *H10P 72/0418* (2026.01); *H10P 72/0436* (2026.01); *H10P 72/33* (2026.01); *H10P 95/00* (2026.01); *H10P 14/6502* (2026.01); *H10P 14/6902* (2026.01)

(56) References Cited

U.S. PATENT DOCUMENTS

| | | | | |
|---|---|---|---|---|
| 2007/0212850 | A1* | 9/2007 | Ingle | C23C 16/045 257/E21.546 |
| 2008/0254644 | A1* | 10/2008 | Aruga | H10D 64/01344 700/121 |
| 2010/0093186 | A1* | 4/2010 | Kobayashi | H10W 10/0145 257/E21.283 |
| 2019/0062947 | A1 | 2/2019 | Savas et al. | |
| 2019/0085457 | A1* | 3/2019 | Ifuku | C23C 16/26 |
| 2020/0140279 | A1 | 5/2020 | Shin et al. | |

FOREIGN PATENT DOCUMENTS

| | | | | |
|---|---|---|---|---|
| JP | H05243211 | A | * | 9/1993 |
| JP | 2004-152862 | A | | 5/2004 |
| JP | 2019-055887 | A | | 4/2019 |
| JP | 2019-178021 | A | | 10/2019 |
| KR | 10-2001-0025041 | A | | 3/2001 |
| KR | 10-2009-0122259 | A | | 11/2009 |
| KR | 10-2020-0135506 | A | | 12/2020 |
| KR | 10-2021-0031763 | A | | 3/2021 |
| WO | 9960615 | A2 | | 11/1999 |
| WO | 2020036819 | A1 | | 2/2020 |

OTHER PUBLICATIONS

Munoz et al., "Direct synthesis of graphene on silicon oxide by low temperature plasma enhanced chemical vapor deposition" , Nanoscale, 2018, vol. 10, pp. 12779-12787.

* cited by examiner

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2021-151289, filed on Sep. 16, 2021, the entire contents of which are incorporated herein by reference.

TECHNICAL FIELD

The present disclosure relates to a substrate processing method and a substrate processing apparatus.

BACKGROUND

In recent years, a graphene film has been proposed as a new thin film barrier layer material to replace a metal nitride film. A graphene film forming technique has proposed to directly form a graphene film on a silicon substrate, an insulating film, or the like by forming a graphene film at a high radical density and a low electron temperature by using, for example, a microwave plasma chemical vapor deposition (CVD) apparatus (e.g., Patent Document 1). In addition, it is known to perform wet cleaning by using, for example, a diluted fluoric acid solution in order to remove a natural oxide film that has adhered to the surface of a substrate before film formation (e.g., Patent Document 2).

PRIOR ART DOCUMENT

Patent Document

Patent Document 1: Japanese Laid-Open Publication No. 2019-055887

Patent Document 2: Japanese Laid-Open Publication No. 2004-152862

SUMMARY

According to one embodiment of the present disclosure, there is provided a substrate processing method including: a carry-in step of carrying a substrate having a silicon-containing film on a surface of the substrate into a processing container; a first step of forming an adsorption layer by supplying an oxygen-containing gas into the processing container and causing the oxygen-containing gas to be adsorbed on a surface of the silicon-containing film; a second step of forming a silicon oxide layer by supplying an argon-containing gas into the processing container and causing the adsorption layer and the surface of the silicon-containing film to react with each other with plasma of the argon-containing gas; and a third step of forming a graphene film on the silicon oxide layer by supplying a carbon-containing gas into the processing container with plasma of the carbon-containing gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a flowchart illustrating an example of a film forming process according to the present embodiment.

FIG. 5 is a flowchart illustrating an example of a film forming process in Modification 1.

FIG. 6 is a view illustrating an example of the state of a substrate after formation of a graphene film in Modification 1.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a process processing method, a substrate processing apparatus, and a semiconductor structure disclosed herein will be described in detail with reference to the drawings. The technology disclosed herein is not limited by the following embodiments.

In the related arts, a metal nitride film (e.g., TiN) has been used as a thin film barrier layer material. In connection with this, graphene has a two-dimensional crystal structure having a carbon six-membered ring structure, and has a dense and flat atomic structure, high thermal conductivity, and chemical and physical stability. For example, when graphene is formed on polycrystalline silicon (poly-Si: hereinafter, also referred to as polysilicon) by using a microwave plasma CVD apparatus, it is necessary to remove a natural oxide film having adhered to the surface. It is known that the natural oxide film is removed through wet cleaning as described above, but the surface of a cleaned substrate is reoxidized by the influence of atmospheric exposure, transportation, and the like before graphene film formation, and a surface oxide on the surface of the substrate may affect graphene film formation. In addition, when a metal film is laminated on polycrystalline silicon, work functions are different at the interface between the polycrystalline silicon and the metal film. Thus, a Schottky contact is formed and a rectifying action is generated, resulting in high resistance. In contrast, it is conceivable that by forming a graphene film between the polycrystalline silicon and the metal film, a Fermi level pinning effect occurs, so the work function difference between the polycrystalline silicon and the metal film is reduced and the resistance is lowered with an ohmic contact. However, when a graphene film is formed on a polycrystalline silicon, a mixed interface layer of SiC and $SiO_2$ is formed, and the resistance between the polycrystalline silicon and the metal film with the graphene film interposed may be high. That is, it is difficult to control the film thickness uniformly, and the insulating film layer of SiC and $SiO_2$ may be formed to be thick. Therefore, it is expected to control the state of an interface layer and to form a graphene film having low resistance and excellent barrier properties.

[Configuration of Film Forming Apparatus 1]

Figure 1:
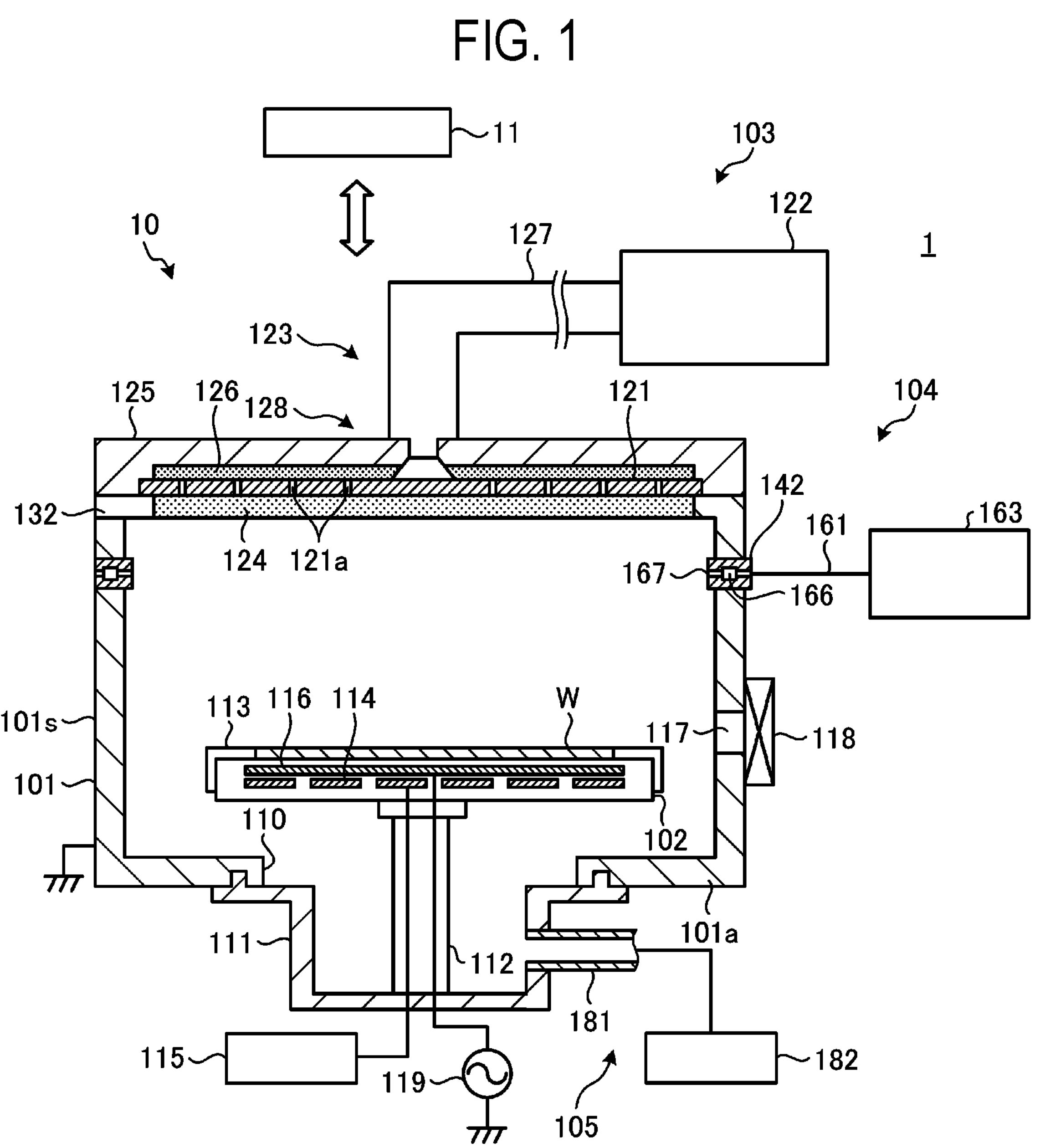
FIG. 1 is a schematic cross-sectional view illustrating an example of a film forming apparatus according to an embodiment of the present disclosure.

FIG. 1 is a schematic cross-sectional view illustrating an example of a film forming apparatus according to an embodiment of the present disclosure. The film forming apparatus 1 illustrated in FIG. 1 is configured as, for example, an RLSA (registered trademark) microwave plasma-type plasma processing apparatus. The film forming apparatus 1 is an example of a substrate processing apparatus.

The film forming apparatus 1 includes an apparatus main body 10 and a controller 11 that controls the apparatus main body 10. The apparatus main body 10 includes a chamber 101, a stage 102, a microwave introduction mechanism 103, a gas supply mechanism 104, and an exhaust mechanism 105.

The chamber 101 is formed in a substantially cylindrical shape, and an opening 110 is formed in a substantially central portion of the bottom wall 101*a* of the chamber 101. The bottom wall 101*a* is provided with an exhaust chamber 111 that communicates with the opening 110 and protrudes downward. An opening 117 through which a substrate (hereinafter, also referred to as a wafer) W passes is formed in the side wall 101*s* of the chamber 101, and the opening 117 is opened/closed by a gate valve 118. The chamber 101 is an example of a processing container.

A substrate W as a processing target is placed on the stage 102. The stage 102 has a substantially disk-like shape and is made of ceramic such as AlN. The stage 102 is supported by a cylindrical support member 112 made of ceramic such as AlN and extending upward from the center of the bottom portion of the exhaust chamber 111. An edge ring 113 is installed on the outer edge of the stage 102 to surround the substrate W placed on the stage 102. Inside the stage 102, lifting pins (not illustrated) for raising and lowering the substrate W are installed to be capable of protruding and retracting with respect to the top surface of the stage 102.

A resistance heating-type heater 114 is embedded inside the stage 102, and the heater 114 heats the substrate W placed on the stage 102 according to the power supplied from a heater power supply 115. A thermocouple (not illustrated) is inserted into the stage 102 so that the temperature of the substrate W can be controlled to, for example, 350 to 850 degrees C. based on a signal from the thermocouple. In the stage 102, an electrode 116 having substantially the same size as the substrate W is embedded above the heater 114, and a bias power supply 119 is electrically connected to the electrode 116. The bias power supply 119 supplies bias power of a predetermined frequency and magnitude to the electrode 116. By the bias power supplied to the electrode 116, ions are drawn into the substrate W placed on the stage 102. The bias power supply 119 may not be provided depending on the characteristics of plasma processing.

The microwave introduction mechanism 103 is installed in an upper portion of the chamber 101 and includes an antenna 121, a microwave output part 122, and a microwave transmission mechanism 123. In the antenna 121, a large number of slots 121*a* which are through holes are formed. The microwave output part 122 outputs microwaves. The microwave transmission mechanism 123 guides the microwaves output from the microwave output part 122 to the antenna 121.

A dielectric window 124 made of a dielectric material is installed under the antenna 121. The dielectric window 124 is supported by a support member 132 installed in a ring shape in the upper portion of the chamber 101. A slow-wave plate 126 is installed on the antenna 121. A shield member 125 is installed on the antenna 121. A flow path (not illustrated) is installed inside the shield member 125, and the shield member 125 cools the antenna 121, the dielectric window 124, and the slow-wave plate 126 by a fluid such as water flowing in the flow path.

The antenna 121 is formed of, for example, a copper plate or an aluminum plate the surface of which is silver-plated or gold-plated, and slots 121*a* for radiating microwaves are arranged in a predetermined pattern. The arrangement pattern of the slots 121*a* is appropriately set such that microwaves are evenly radiated. An example of a suitable pattern includes a radial line slot in which pairs of slots 121*a* are concentrically arranged, and the two slots 121*a* in each pair are arranged in a T shape. The lengths and the arrangement intervals of the slots 121*a* are appropriately determined according to the effective wavelength $\lambda g$ of microwaves. The slots 121*a* may have other shapes such as a circular shape and an arc shape. The arrangement form of the slots 121*a* is not particularly limited, and the slots 121*a* may be arranged, for example, in a spiral shape or a radial shape, in addition to the concentric circle shape. The pattern of the slots 121*a* is appropriately set to have a microwave radiation characteristic that obtains a desired plasma density distribution.

The slow-wave plate 126 is made of a dielectric material having a dielectric constant larger than that of vacuum, such as quartz, ceramics ($Al_2O_3$), polytetrafluoroethylene, and polyimide. The slow-wave plate 126 has a function of making the wavelength of microwaves shorter than that in vacuum to make the antenna 121 smaller. The dielectric window 124 is also made of a similar dielectric material.

The thicknesses of the dielectric window 124 and the slow-wave plate 126 are adjusted such that an equivalent circuit formed by the slow-wave plate 126, the antenna 121, the dielectric window 124 and plasma satisfies a resonance condition. By adjusting the thickness of the slow wave plate 126, it is possible to adjust the phase of microwaves. By adjusting the thickness of the slow-wave plate 126 such that a bonded portion of the antenna 121 becomes an "antinode" of a standing wave, the reflection of microwaves is minimized, so that it is possible to maximize the radiation energy of the microwaves. By using the same material for the slow-wave plate 126 and the dielectric window 124, it is possible to prevent interfacial reflection of microwaves.

The microwave output part 122 includes a microwave oscillator. The microwave oscillator may be of a magnetron type or a solid state type. The frequency of microwaves generated by the microwave oscillator is, for example, a frequency of 300 MHz to 10 GHz. As an example, the microwave output part 122 outputs a 2.45 GHz microwaves by a magnetron-type microwave oscillator. Microwaves are an example of electromagnetic waves.

The microwave transmission mechanism 123 includes a waveguide 127 and a coaxial waveguide 128. The microwave transmission mechanism 123 may further include a mode conversion mechanism. The waveguide 127 guides microwaves output from the microwave output part 122. The coaxial waveguide 128 includes an inner conductor connected to the center of the antenna 121 and an outer conductor outside the inner conductor. The mode conversion mechanism is provided between the waveguide 127 and the coaxial waveguide 128. The microwaves output from the microwave output part 122 propagate in the waveguide 127 in a Transverse Electric (TE) mode, and are converted from the TE mode to a Transverse Electromagnetic (TEM) mode by the mode conversion mechanism. The microwaves converted into the TEM mode propagate to the slow-wave plate 126 via the coaxial waveguide 128, and are radiated within the chamber 101 by passing through the slots 121*a* in the antenna 121 and the dielectric window 124 from the slow-wave plate 126. A tuner (not illustrated) for matching the impedance of a load (plasma) in the chamber 101 with the output impedance of the microwave output part 122 is provided in the middle of the waveguide 127.

The gas supply mechanism 104 has a shower ring 142 having a ring shape along the inner wall of the chamber 101. The shower ring 142 includes a ring-shaped flow path 166 provided therein, and a large number of ejection ports 167 connected to the flow path 166 and opened inside the flow path 166. A gas supplier 163 is connected to the flow path 166 via a pipe 161. The gas supplier 163 includes gas sources and flow rate controllers. In an embodiment, the gas supplier 163 is configured to supply at least one processing gas from the corresponding gas source to the shower ring 142 via the corresponding flow rate controller. The gas supplied to the shower ring 142 is supplied into the chamber 101 from the ejection ports 167.

When a graphene film is formed on a substrate W, the gas supplier 163 supplies a carbon-containing gas, a hydrogen-containing gas, and a rare gas, each of which is controlled to a predetermined flow rate, into the chamber 101 via the shower ring 142. In the present embodiment, the carbon-containing gas is, for example, $C_2H_2$ gas. Instead of $C_2H_2$ gas or in addition to $C_2H_2$ gas, $C_2H_4$ gas, $CH_4$ gas, $C_2H_6$ gas, $C_3H_8$ gas, $C_3H_6$ gas, and the like may be used. In the present embodiment, the hydrogen-containing gas is, for example, hydrogen gas. Instead of hydrogen gas or in addition to hydrogen gas, a halogen-based gas, such as $F_2$ (fluorine) gas, $Cl_2$ (chlorine) gas, or $Br_2$ (bromine) gas, may be used. In the present embodiment, the rare gas is, for example, Ar gas. Instead of Ar gas, another rare gas such as He gas may be used.

The exhaust mechanism 105 may include an exhaust chamber 111, an exhaust pipe 181 installed in the side wall of the exhaust chamber 111, and an exhaust apparatus 182 connected to the exhaust pipe 181. The exhaust apparatus 182 includes a vacuum pump, a pressure control valve, and the like.

The controller 11 has a memory, a processor, and an input/output interface. The memory stores a program executed by the processor and a recipe including conditions for respective processes. The processor executes a program read from the memory, and controls each part of the apparatus main body 10 via an input/output interface based on the recipe stored in the memory.

For example, the controller 11 controls each part of the film forming apparatus 1 to perform a film forming method to be described later. As a detailed example, the controller 11 executes a carry-in step of carrying a substrate (wafer W) having a silicon-containing film on the surface thereof into the chamber 101. The controller 11 executes a first step of forming an adsorption layer by supplying an oxygen-containing gas into the chamber 101 and causing oxygen to be adsorbed on the surface of the silicon-containing film. The controller 11 executes a second step of forming the silicon oxide layer by supplying an argon-containing gas into the chamber 101 and causing the adsorption layer and the surface of the silicon-containing film to react with each other with the plasma of the argon-containing gas. The controller 11 executes a third step of forming a graphene film on the silicon oxide layer with the plasma of the carbon-containing gas by supplying a carbon-containing gas into the chamber 101. Here, as the carbon-containing gas, acetylene ($C_2H_2$) gas supplied from the gas supplier 163 may be used. In addition, as the argon-containing gas, Ar gas supplied from the gas supplier 163 may be used. In addition, as the oxygen-containing gas, $O_2$ gas supplied from the gas supplier 163 may be used. The carbon-containing gas is not limited to acetylene. For example, ethylene ($C_2H_4$), methane ($CH_4$), ethane ($C_2H_6$), propane ($C_3H_8$), propylene ($C_3H_6$), methanol ($CH_3OH$), ethanol ($C_2H_5OH$) and the like may be used. The oxygen-containing gas is not limited to $O_2$ gas, but may be $O_3$ gas or the like.

Silicon Oxide Layer

Figure 2:
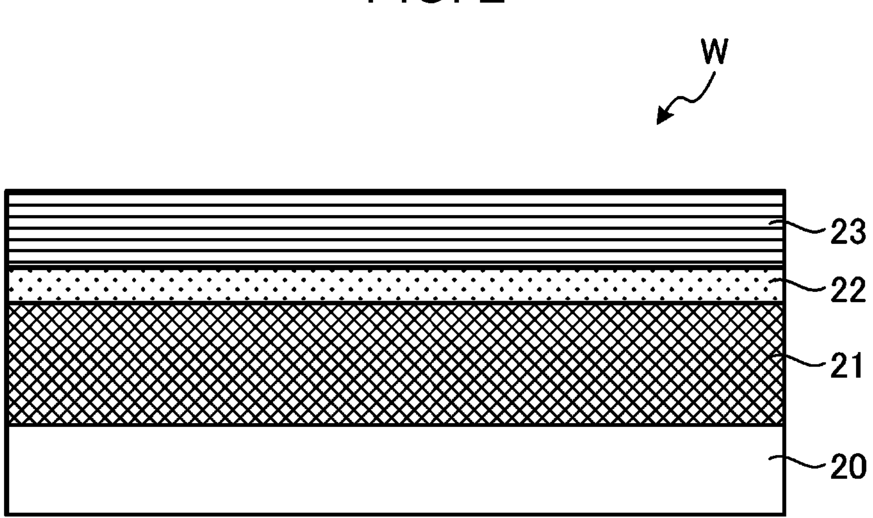
FIG. 2 is a view illustrating an example of the state of a substrate after formation of a graphene film in the present embodiment.

Next, the state of a substrate after a graphene film is formed will be described with reference to FIGS. 2 and 3. FIG. 2 is a view illustrating an example of the state of a substrate after a graphene film is formed in the present embodiment. As illustrated in FIG. 2, in the wafer W, a polysilicon film 21 is formed on a silicon substrate 20. The polysilicon film 21 is an example of a silicon-containing film. A silicon oxide layer 22 is formed on the surface of the polysilicon film 21. In addition, a graphene film 23 is formed on the silicon oxide layer 22.

Figure 3:
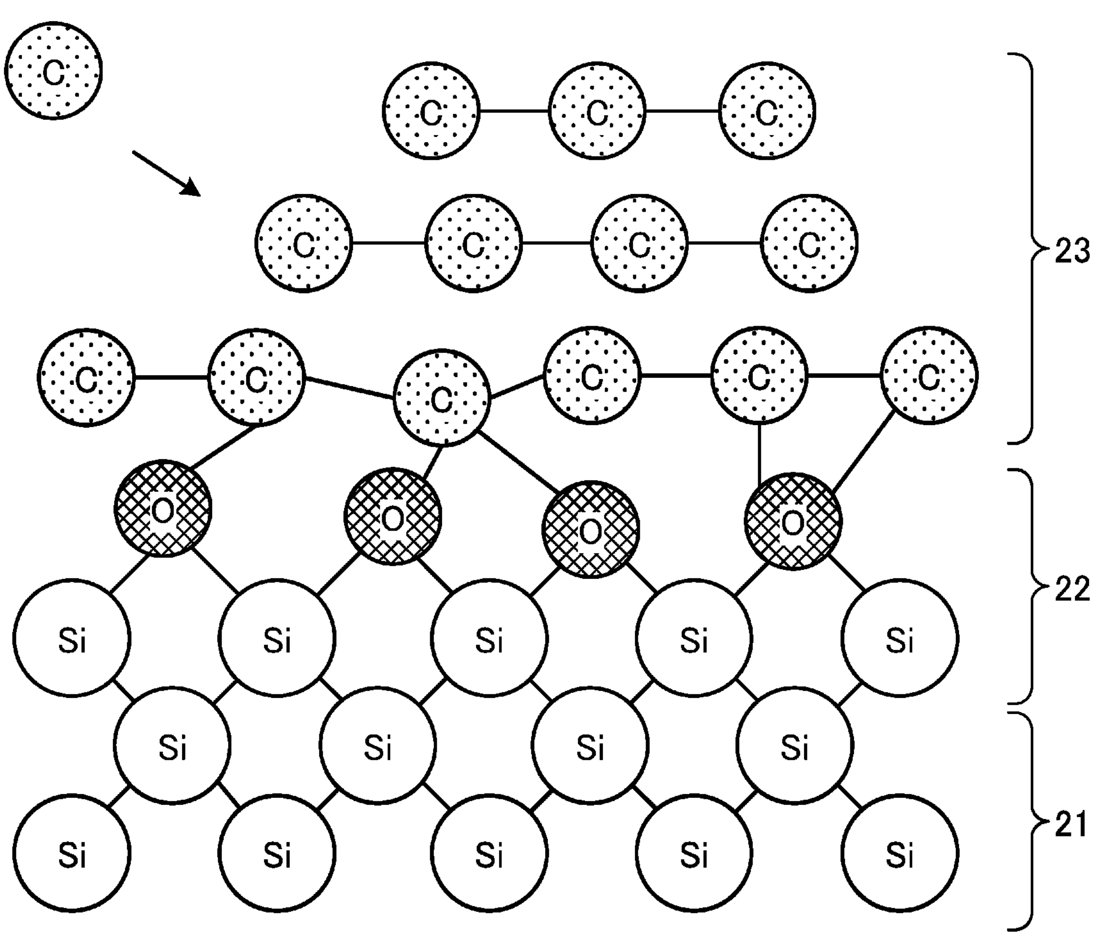
FIG. 3 is a view illustrating an example of the state of a silicon oxide layer in the present embodiment.

FIG. 3 is a view illustrating an example of the state of a silicon oxide layer in the present embodiment. As illustrated in FIG. 3, the silicon oxide layer 22 is an oxide layer having an amorphous structure of an ultrathin film of, for example, 1 nm or less, which is formed on the surface of the polysilicon film 21. That is, the silicon oxide layer 22 and the graphene film 23 form a composite barrier structure of an oxide layer having an amorphous structure and graphene which is a two-dimensional crystal material. Since the stable silicon oxide layer 22 is formed on the surface of the polysilicon film 21 prior to forming the graphene film 23, it is possible to suppress the formation of SiC in the initial layer of the graphene film 23 and to directly laminate graphene on the silicon oxide layer 22. That is, since the insulating layer that enters the interface between the polysilicon film 21 and the graphene film 23 is only the silicon oxide layer 22, it is easy to control Fermi level pinning. In addition, by intentionally forming the silicon oxide layer 22, it is possible to control the thickness of the silicon oxide layer 22 to 1 nm or less.

Since the silicon oxide layer 22 is an ultrathin film, electrons are tunneled between the polysilicon film 21 and the graphene film 23. That is, there is electrical conductivity between the polysilicon film 21 and the graphene film 23. That is, when a metal film (e.g., a tungsten (W)-containing film) (not illustrated) is formed on the graphene film 23, the polysilicon film 21 and the metal film with the silicon oxide layer 22 and the graphene film 23 interposed come into ohmic contact with each other to have a low resistance. The silicon oxide layer 22 may be formed directly on the silicon substrate 20 on which the polysilicon film 21 is not provided. That is, the wafer W includes a silicon oxide layer 22 which is an amorphous structural layer of 1 nm or less formed on the polysilicon film 21 or the surface of the silicon substrate 20, a graphene film 23, which is a two-dimensional structural film formed on the silicon oxide layer 22, and a metal film (a metal material film) formed on the graphene film 23. Due to the Fermi level pinning effect of the graphene film 23, a semiconductor structure in which the polysilicon film 21 or the silicon substrate 20 comes into ohmic contact with the metal film is formed.

Regarding the barrier property of the graphene film 23, graphene is a sheet-like two-dimensional crystal material having a carbon six-membered ring structure, and the barrier property of the material itself is high. However, in the graphene formation through CVD, graphene is formed as a polycrystalline material and crystal grain boundaries (domain grain boundaries) are present in the graphene. Since carbon bonds are sparse at the grain boundaries, the barrier property is lowered. In contrast, since the silicon oxide layer 22 has an amorphous structure. Thus, the silicon oxide layer 22 has no grain boundaries and is able to complement the barrier property. Therefore, it is possible to provide good barrier property by using the silicon oxide layer 22 and the graphene film 23 in combination.

Regarding the crystallinity of the graphene film 23, the higher the continuity of the carbon six-membered ring structure, the better the crystallinity of graphene, and the better the electrical conductivity or barrier property. Graphene film formation forms nuclei on an underlayer film and grows to spread in the plane direction from the formed nuclei. At this time, when the graphene six-membered ring is inconsistent due to a lattice misfit with the underlayer film, a crystal defect in the graphene occurs and the graphene six-membered ring becomes discontinuous. In order to an improvement in this discontinuity, it is important that the surface of the underlayer film has an amorphous structure that does not have crystallinity. Since the surface of the amorphous structure does not have crystallinity, graphene does not have a lattice misfit with respect to the underlayer film, which makes it possible to form graphene having few defects and high crystallinity. That is, since the silicon oxide layer 22 has an amorphous structure, it is possible to cancel the crystal lattice surface of the polysilicon film 21. That is, on the silicon oxide layer 22, it is possible to form a graphene film 23 having high crystallinity.

[Film Forming Method]

Figure 4:
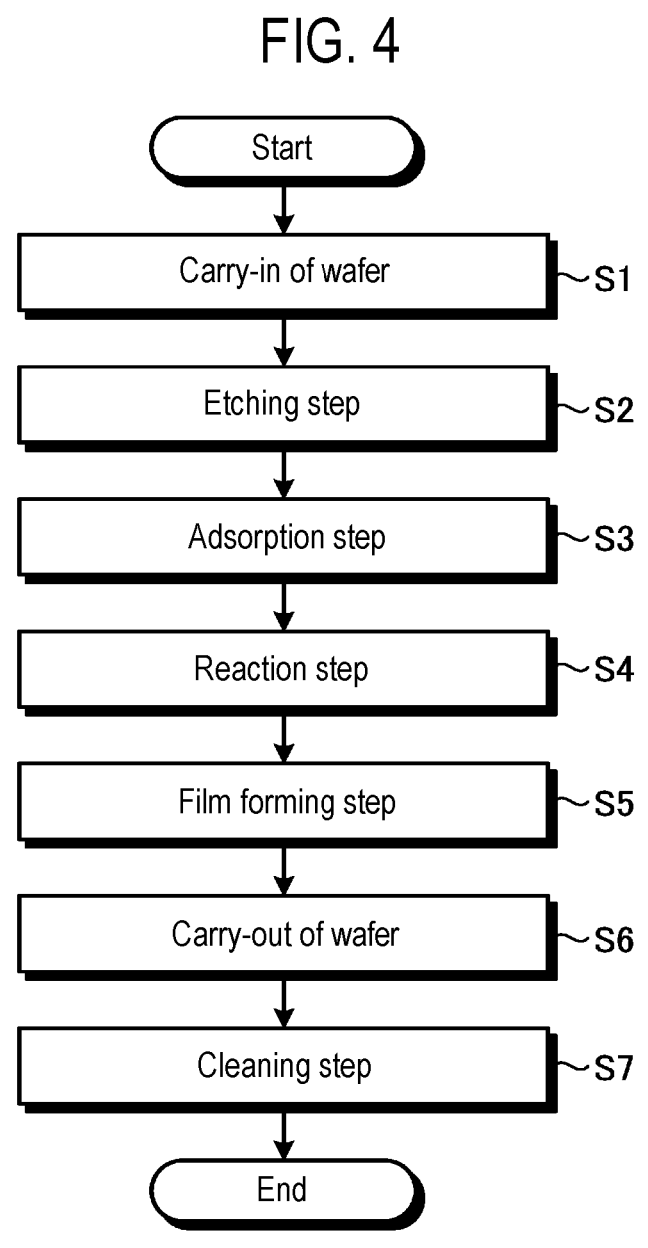

Subsequently, a film forming process according to the present embodiment will be described. FIG. 4 is a flowchart illustrating an example of a film forming process according to the present embodiment.

In the film forming process according to the present embodiment, first, the controller 11 controls the gate valve 118 to open the opening 117. When the opening 117 is opened, a wafer W is carried into the processing space of the chamber 101 through the opening 117 and placed on the stage 102. That is, the controller 11 carries the wafer W into the chamber 101 (step S1). The controller 11 controls the gate valve 118 to close the opening 117.

The controller 11 reduces the pressure in the chamber 101 to a predetermined pressure (e.g., 5 mTorr to 400 mTorr) in the state in which the wafer W received by substrate support pins (not illustrated) is held at the first position. Here, the first position is a position where the wafer W is supported above the stage 102, for example, a position 10 mm to 15 mm from the top surface of the stage 102. The controller 11 supplies a hydrogen-containing gas, which is a plasma-generating gas, to the chamber 101 from the ejection ports 167. The hydrogen-containing gas is a gas including hydrogen ($H_2$) gas and an inert gas (Ar gas). The controller 11 guides microwaves output from the microwave output part 122 of the microwave introduction mechanism 103 to the antenna 121, radiates the microwaves from the antenna 121, and ignites plasma. The controller 11 executes an etching step of removing an oxide on the polysilicon film 21 with plasma of the hydrogen-containing gas for a predetermined time (e.g., 5 seconds to 15 minutes) (step S2). At this time, the controller 11 controls the time for removing the oxide (etching time) so that the temperature of the wafer W is 250 degrees C. or lower. The etching step is an example of the fourth step. The oxide removed in the etching step may include a natural oxide film. When the oxide on the polysilicon film 21 is removed by another method such as wet cleaning, the etching step may be omitted.

When the etching step is completed, the controller 11 stops the supply of microwaves and stops the plasma generation in the state in which the wafer W is held at the first position. The controller 11 supplies the oxygen-containing gas to the chamber 101 from the ejection ports 167. The controller 11 executes an adsorption step of forming an adsorption layer by exposing the surface of the polysilicon film 21 to an oxygen-containing gas for a predetermined time (e.g., 10 to 60 seconds) and causing oxygen to be adsorbed on the surface without oxidizing the surface of the polysilicon film 21 (step S3). At this time, the controller 11 controls the time of the adsorption step such that the temperature of the wafer W is 250 degrees C. or lower. In the adsorption step, the controller 11 stops the supply of the oxygen-containing gas after the adsorption layer is formed after a predetermined time elapses, and controls the exhaust mechanism 105 to evacuate the interior of the chamber 101. At this time, the gas supplied to the chamber 101 may be switched from the oxygen-containing gas to the argon-containing gas. The adsorption step is an example of the first step.

When the adsorption step is completed, the controller 11 lowers the substrate support pins (not illustrated) and places the wafer W on the stage 102. That is, the wafer W is held at the second position. The controller 11 controls the pressure in the chamber 101 to a predetermined pressure (e.g., 5 mTorr to 500 mTorr) in the state in which the wafer W is placed on the stage 102. In addition, the controller 11 controls the temperature of the wafer W to be a predetermined temperature (e.g., 400 degrees C. or higher). That is, the controller 11 controls the temperature of the wafer W to be higher than that in the adsorption step. The controller 11 supplies an argon-containing gas, which is a plasma-generating gas, to the chamber 101 from the ejection ports 167. The controller 11 controls the microwave introduction mechanism 103 to ignite plasma. The controller 11 executes a reaction step of forming a silicon oxide layer 22 by causing the adsorption layer and the surface of the polysilicon film 21 with each other with plasma of the argon-containing gas for a predetermined time (e.g., 5 to 60 seconds) (step S4). The temperature of the wafer W in the reaction step may be higher than the temperature of the wafer W in the film forming step. Hydrogen ($H_2$) gas may be mixed with the argon-containing gas. By mixing hydrogen gas, it is possible to remove excess oxygen that does not participate in the reaction on the surface of the polysilicon film 21, and to reduce an excess oxidation reaction with silicon. The reaction step is an example of the second step.

In the adsorption step and the reaction step, after the adsorption step is executed in a state in which the wafer W is held at the first position, the plasma may be ignited while supplying the oxygen-containing gas to the chamber 101 at the first position. In this case, it is possible to form the silicon oxide layer 22 at a lower temperature than that in the case where the wafer W is placed on the stage 102.

When the reaction process is completed, the controller 11 controls the pressure in the chamber 101 to a predetermined pressure (e.g., 5 mTorr to 500 mTorr) in the state in which the wafer W is placed on the stage 102. In addition, the controller 11 controls the temperature of the wafer W to be a predetermined temperature (e.g., 400 degrees C. or higher). That is, the controller 11 controls the temperature of the wafer W to be higher than that in the adsorption step. The controller 11 supplies a carbon-containing gas, which is a plasma-generating gas, to the chamber 101 from the ejection ports 167. The controller 11 controls the microwave introduction mechanism 103 to ignite plasma. The controller 11 executes a film forming step of forming a graphene film 23 on the silicon oxide layer 22 with plasma of the carbon-containing gas for a predetermined time (e.g., 5 seconds to 60 minutes) (step S5). The film forming step is an example of the third step.

When the film forming process is completed, the controller 11 controls the gate valve 118 to open the opening 117. The controller 11 raises the wafer W by causing the substrate support pins (not illustrated) to protrude from the top surface of the stage 102. When the opening 117 is opened, the wafer W is carried out from the interior of the chamber 101 through the opening 117 by an arm of a transport chamber (not illustrated). That is, the controller 11 carries out the wafer W from the interior of the chamber 101 (step S6).

When the wafer W is carried out, the controller 11 executes a cleaning step of cleaning the interior of the chamber 101 (step S7). In the cleaning step, a dummy wafer is placed on the stage 102, a cleaning gas is supplied into the chamber 101 to clean a carbon film such as an amorphous carbon film having adhered to the inner wall of the chamber 101. Although $O_2$ gas may be used as the cleaning gas, the cleaning gas may be an oxygen-containing gas such as CO gas and $CO_2$ gas. In addition, the cleaning gas may contain a rare gas such as Ar gas. The dummy wafer may not be provided. When the cleaning step is completed, the controller 11 ends the film forming process. As described above, since a silicon oxide layer 22 is formed on the surface of a polysilicon film 21 and a graphene film 23 is formed on the silicon oxide layer 22, it is possible to control the state of an interface layer and to form a graphene film 23 having low resistance and excellent barrier properties.

Modification 1

In the above-described embodiment, the graphene film 23 is directly formed on the silicon oxide layer 22, but a modification step of modifying the outermost surface of the silicon oxide layer 22 to SiOC may be provided. The embodiment in this case will be described as Modification 1. Since the film forming apparatus 1 in Modification 1 is the same as the film forming apparatus 1 of the above-described embodiment, a description of overlapping configurations and operations thereof will be omitted.

Figure 5:
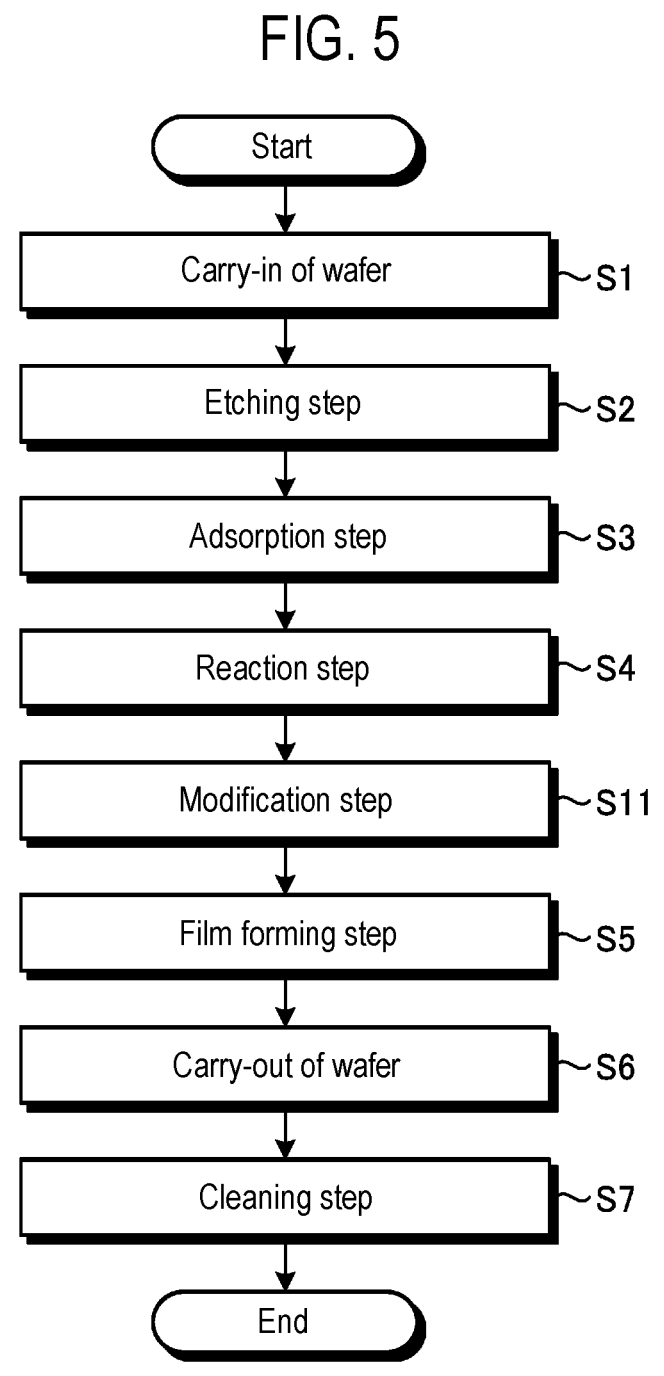

FIG. 5 is a flowchart illustrating an example of a film forming process in Modification 1. As illustrated in FIG. 5, the controller 11 executes the processes of steps S1 to S4 in the same manner as in the above-described embodiment. Following step S4, the controller 11 supplies a mixed gas containing an argon-containing gas and a carbon-containing gas, which are plasma-generating gases, into the chamber 101 from the ejection ports 167 in the state in which a wafer W is placed on the stage 102. The ratio of the carbon-containing gas in the mixed gas is lower than that in the film forming step (e.g., the ratio of the carbon-containing gas to the argon-containing gas is 0.1 to 5.0%). The controller 11 controls the microwave introduction mechanism 103 to ignite plasma. The controller 11 executes a modification step of modifying the surface of the silicon oxide layer 22 with plasma of the above-mentioned mixed gas for a predetermined time (e.g., 5 seconds to 60 seconds) (step S11). The modification step is an example of the fifth step. When the modification step is completed, the controller 11 proceeds to the film forming step of step S5. By the modification step, since carbon in the plasma atmosphere acts on the activated $SiO_2$ to form SiOC bonds on the outermost surface of the silicon oxide layer 22, i.e., since the outermost surface of the silicon oxide layer 22 is modified to SiOC, it is possible to improve adhesion of the graphene film 23.

In Modification 1, hydrogen ($H_2$) gas may be mixed with the mixed gas containing the argon-containing gas and the carbon-containing gas for performing modification to SiOC. By mixing hydrogen gas, it is possible to remove excess oxygen that does not participate in the reaction on the surface of the polysilicon film 21, and to reduce an excess oxidation reaction with silicon. Since C—C bonds are etched by introducing hydrogen, SiOC bonds are preferentially formed on the outermost surface of the silicon oxide layer 22. Then, by forming the graphene film 23 with C—C bonds thereafter, it is possible to form graphene having higher crystallinity.

Figure 6:
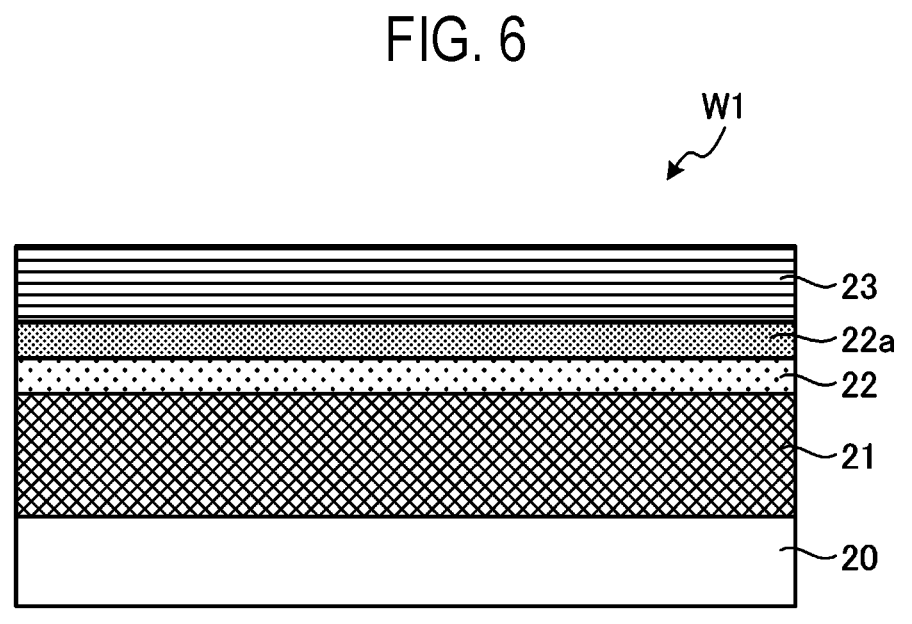
Figure 7:
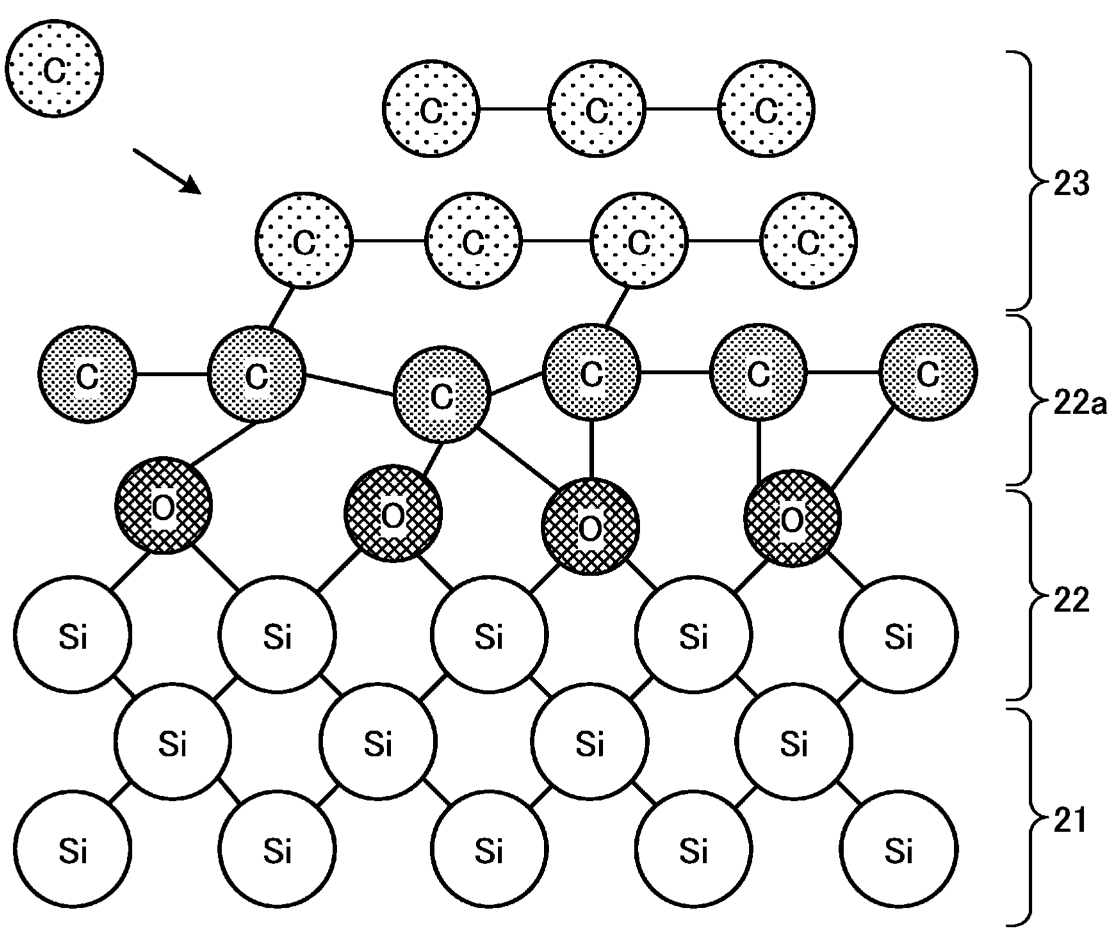
FIG. 7 is a view illustrating an example of the state of a silicon oxide layer in Modification 1.

Here, the state of the wafer when the modification step has been executed with reference to FIGS. 6 and 7. FIG. 6 is a view illustrating an example of the state of a substrate after formation of a graphene film in Modification 1. As illustrated in FIG. 6, in a wafer W1, a polysilicon film 21 is formed on a silicon substrate 20. A silicon oxide layer 22 is formed on the surface of the polysilicon film 21. The outermost surface of the silicon oxide layer 22 is modified to SiOC and turned into a modified layer 22*a*. In addition, a graphene film 23 is formed on the modified layer 22*a*.

FIG. 7 is a view illustrating an example of the state of a silicon oxide layer in Modification 1. As illustrated in FIG. 7, on the surface of the polysilicon film 21, for example, a silicon oxide layer 22 which is an oxide layer having an amorphous structure of an ultrathin film of 1 nm or less is formed. The outermost surface of the silicon oxide layer 22 is modified into a modified layer 22*a*. In Modification 1, since the outermost surface of the silicon oxide layer 22 is activated and modified into SiOC bonds (the modified layer 22*a*), carbon in the plasma atmosphere does not penetrate into the polysilicon film 21 beyond the silicon oxide layer 22. In addition, since the modified layer 22*a* functions as a bonding layer between the silicon oxide layer 22 and the graphene film 23, it is possible to improve the adhesion of the graphene film 23. That is, it is possible to improve the adhesion of the graphene film 23 to the polysilicon film 21.

Modification 2

In the above-described embodiment, the oxygen adsorbed on the surface of the polysilicon film 21 is reacted by plasma processing to form the silicon oxide layer 22, but the present disclosure is not limited thereto. For example, the silicon oxide layer 22 may be formed by irradiating the adsorbed oxygen with ultraviolet rays to react, and the embodiment in this case will be described as Modification 2. Since the film forming apparatus 1 in Modification 2 is the same as the film forming apparatus 1 of the above-described embodiment, a description of overlapping configurations and operations thereof will be omitted.

Figure 8:
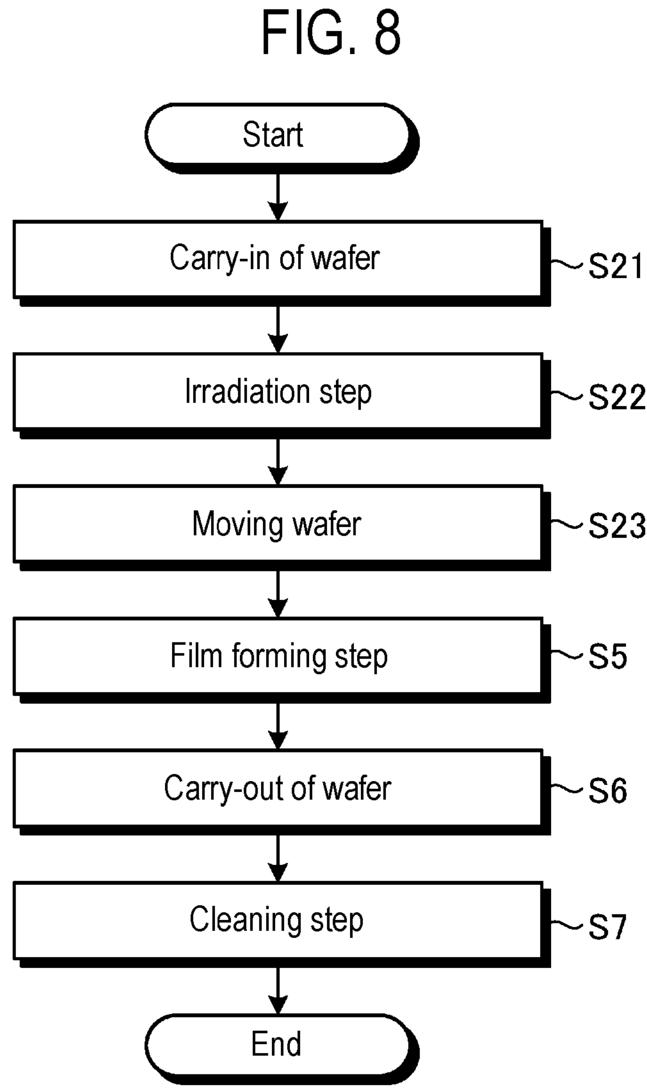
FIG. 8 is a flowchart illustrating an example of a film forming process in Modification 2.

FIG. 8 is a flowchart illustrating an example of a film forming process in Modification 2. As illustrated in FIG. 8, the controller 11 controls a gate valve of an ultraviolet irradiation chamber (not illustrated) to open the opening.

When the opening is opened, a wafer W is carried into the processing space of the chamber through the opening and placed on the stage. That is, the controller 11 performs control to carry the wafer W into the ultraviolet irradiation chamber (step S21). The controller 11 controls the gate valve to close the opening. In Modification 2, the ultraviolet irradiation chamber is an example of the first processing container, and the chamber 101 is an example of the second processing container.

The controller 11 performs control to place, on the stage, the wafer W received by the substrate support pins (not illustrated) in the ultraviolet irradiation chamber. The controller 11 reduces the pressure in the ultraviolet irradiation chamber to a predetermined pressure (e.g., 5 mTorr to 200 mTorr). The controller 11 supplies an oxygen-containing gas (e.g., $O_2$ gas or $O_3$ gas) to the ultraviolet irradiation chamber. The controller 11 executes an irradiation step of irradiating the wafer W with ultraviolet rays for a predetermined time (e.g., 5 seconds to 10 minutes) by controlling an ultraviolet lamp, and forming a silicon oxide layer 22 by causing the oxygen radicals generated in the chamber and the surface of the polysilicon film 21 to react with each other (step S22). As the ultraviolet rays for irradiation, for example, ultraviolet rays having a wavelength of 200 nm or less may be used. Here, since oxygen radicals do not have ionic directional energy, it is possible to form the silicon oxide layer 22 only on the outermost surface without proceeding with oxidation in the film thickness direction of the polysilicon film 21. In order to control the oxidation reaction, the wafer W may be heated.

When the irradiation step is completed, the controller 11 controls the gate valve of the ultraviolet radiation chamber to open the opening. The controller 11 performs control to cause the substrate support pins (not illustrated) to protrude from the top surface of the stage to raise the wafer W. When the opening is opened, the wafer W is carried out from the ultraviolet irradiation chamber through the opening by an arm of a transport chamber (not illustrated). The controller 11 controls the gate valve 118 of the chamber 101 to open the opening 117. When the opening 117 is opened, the wafer W is carried into the processing space of the chamber 101 through the opening 117 and placed on the stage 102. That is, the controller 11 performs control to carry, into the chamber 101, the wafer W having a silicon oxide layer 22 formed on the surface of the polysilicon film 21. That is, the controller 11 performs control to move the wafer W from the ultraviolet irradiation chamber to the chamber 101 (step S23). The controller 11 controls the gate valve 118 to close the opening 117. When the wafer W is moved to the chamber 101, the controller 11 proceeds to the film forming step of step S5. As described above, it is possible to form the silicon oxide layer 22 on the surface of the polysilicon film 21 even by irradiation with ultraviolet rays.

The ultraviolet irradiation chamber and the chamber 101 may be connected as a cluster and the wafer W may be transported in a vacuum atmosphere, or the wafer W may be transported by being opened to the air between stand-alone apparatuses. Since the silicon oxide layer 22 is formed on the wafer W in the ultraviolet irradiation chamber, the silicon oxide layer 22 itself serves as a barrier layer against oxygen. Therefore, even if the wafer W is once taken out of the vacuum atmosphere, oxidation does not proceed beyond the silicon oxide layer 22.

Modification 3

In the above embodiment, no particular processes are performed on the interior of the chamber 101 before a wafer W is carried in, but a degassing step of removing oxygen components remaining on the inner wall of the chamber 101 or the like in order to reduce the influence of the cleaning step may be executed, and the embodiment in this case will be described as Modification 3. Since the film forming apparatus 1 in Modification 3 is the same as the film forming apparatus 1 of the above-described embodiment, a description of overlapping configurations and operations thereof will be omitted.

In Modification 3, the degassing step for reducing the influence of the previous cleaning step is executed prior to the carry-in of the wafer W of the embodiment, that is, prior to step S1. The controller 11 supplies a hydrogen-containing gas to the chamber 101 from the ejection ports 167. In addition, the controller 11 controls the pressure in the chamber 101 to a predetermined pressure (e.g., 50 mTorr to 1 Torr). As the hydrogen-containing gas in the degassing step, for example, $H_2$ gas or $Ar/H_2$ gas may be used. The controller 11 controls the microwave introduction mechanism 103 to ignite plasma. The controller 11 executes the degassing step with plasma of the hydrogen-containing gas for a predetermined time (e.g., 120 to 180 seconds). In the degassing step, the oxidizing components such as $O_2$ and $H_2O$ remaining in the chamber 101 are discharged as OH radicals. It is not necessary to use a dummy wafer in the cleaning step and the degassing step. In addition, nitrogen may be added to the degassing step. By adding nitrogen, it is possible to improve the effect of discharging oxidizing components as NO radicals in addition to OH radicals. In the degassing step, the pressure may be changed in multiple stages during the execution of the step. By changing the pressure in multiple stages, it is possible to control the spread of plasma. By controlling the spread of plasma by changing the pressure, it is possible to efficiently irradiate oxygen remaining in the chamber 101 with plasma, and thus it is possible to improve the effect of removing the residual oxygen.

As described above, according to the present embodiment, the substrate processing apparatus (the film forming apparatus 1) includes a processing container (the chamber 101) capable of accommodating a substrate (the wafer W) having a silicon-containing film (the polysilicon film 21) on the surface of the substrate, and a controller 11. The controller 11 is configured to execute: a carry-in step of carrying a substrate having a silicon-containing film on a surface of the substrate into a processing container; a first step (adsorption step) of forming an adsorption layer by supplying an oxygen-containing gas into the processing container and causing the oxygen-containing gas to be adsorbed on the surface of the silicon-containing film; a second step (reaction step) of forming a silicon oxide layer 22 by supplying an argon-containing gas into the processing container and causing the adsorption layer and the surface of the silicon-containing film to react with each other with plasma of the argon-containing gas; and a third step (reaction step) of forming a graphene film 23 on the silicon oxide layer 22 by supplying a carbon-containing gas into the processing container with plasma of the carbon-containing gas. As a result, it is possible to form a graphene film 23 having low resistance and excellent barrier properties.

According to the present embodiment, the first step is executed in a state in which the substrate support pins of a stage (the stage 102) are raised to hold the carried-in substrate at the first position, and the second step and the third step are executed in a state in which the substrate support pins are lowered and the substrate is held at the second position. As a result, it is possible to control the film thickness of the silicon oxide layer 22 to form an ultrathin film.

According to the present embodiment, the first position is the position where the substrate is supported above the stage, and the second position is the position where the substrate is placed on the stage. As a result, it is possible to control the film thickness of the silicon oxide layer 22 to form an ultrathin film.

According to the present embodiment, the first position is a position of 10 mm to 15 mm from the top surface of the stage. As a result, it is possible to control the film thickness of the silicon oxide layer 22 to form an ultrathin film.

According to the present embodiment, in the first step, after the adsorption layer is formed, the supply of the oxygen-containing gas is stopped and the interior of the processing container is evacuated. As a result, it is possible to control the film thickness of the silicon oxide layer 22 to form an ultrathin film.

According to the present embodiment, prior to the first step, a fourth step (etching step) of etching an oxide formed on the surface of the silicon-containing film is further included. As a result, it is possible to form a silicon oxide layer 22 having a controlled film thickness on the polysilicon film 21.

According to the present embodiment, in the fourth step, the oxide is etched through processing with plasma of a mixed gas containing the hydrogen-containing gas. As a result, it is possible to form a silicon oxide layer 22 having a controlled film thickness on the polysilicon film 21.

According to Modification 1, prior to the third step, a fifth step (modification step) of modifying the surface of the silicon oxide layer 22 with plasma of a mixed gas including an argon-containing gas and a carbon-containing gas is further included. As a result, it is possible to improve the adhesion of the graphene film 23 to the polysilicon film 21.

According to the present embodiment, the first step is executed at a first temperature, and the second step and the third step are executed at a second temperature higher than the first temperature. As a result, it is possible to form a graphene film 23 having low resistance and excellent barrier properties.

According to the present embodiment, the first temperature is a temperature of 250 degrees C. or lower, and the second temperature is a temperature of 400 degrees C. or higher. As a result, it is possible to form a graphene film 23 having low resistance and excellent barrier properties.

According to Modification 3, prior to the carry-in step, a pre-step of performing plasma processing in a state in which the substrate is not present in the processing container is further included, and the pre-step includes a degassing step of drawing out and removing oxygen in the processing container by using plasma of a hydrogen-containing gas. As a result, it is possible to improve the controllability of the adsorption step and the reaction step.

According to Modification 2, the substrate processing apparatus includes a first processing container and a second processing container capable of accommodating a substrate having a silicon-containing film on a surface thereof, and a controller 11. The controller 11 is configured to execute: a first step of carrying a substrate having a silicon-containing film on the surface of the substrate into the first processing container; a second step of forming a silicon oxide layer 22 by supplying an oxygen-containing gas into the first processing container and causing oxygen radicals generated by irradiating the oxygen-containing gas with ultraviolet rays and a surface of the silicon-containing film to react with each other; a third step of carrying the substrate having the silicon oxide layer 22 formed on the surface of the silicon-containing film into a second processing container; and a fourth step of forming a graphene film 23 on the silicon oxide layer 22 by supplying a carbon-containing gas into the second processing container with plasma of the carbon-containing gas. As a result, it is possible to form a graphene film 23 having low resistance and excellent barrier properties.

According to the present embodiment, the semiconductor structure includes: an amorphous structural layer formed on a surface of a polysilicon film 21 on a substrate or on a surface of a silicon substrate 20; a two-dimensional structural film formed on the amorphous structural layer; and a metal material film formed on the dimensional structural film, wherein the amorphous structural layer is a silicon oxide layer 22 of 1 nm or less, and the two-dimensional structural film is a graphene film 23, and due to the Fermi level pinning effect of the graphene film 23, the polysilicon film 21 or the silicon substrate 20 comes into ohmic contact with the metal material film. As a result, it is possible to make the polysilicon film 21 or the silicon substrate 20 come into contact with the metal material film in a state of low resistance and excellent barrier properties.

It should be understood that the embodiments disclosed herein are exemplary in all respects and are not restrictive. The embodiments described above may be omitted, replaced, or modified in various forms without departing from the scope and spirit of the appended claims.

In the above-described embodiment, a film forming apparatus 1 that performs processes such as etching and film formation on a wafer W by using microwave plasma as a plasma source has been described as an example, but the disclosed technique is limited thereto. If an apparatus uses plasma to process a wafer W, the plasma source is not limited to microwave plasma, and may use any plasma source such as capacitively-coupled plasma, microwave plasma, or magnetron plasma.

According to the present disclosure, it is possible to form a graphene film having low resistance and excellent barrier properties.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:

a carry-in step of carrying a substrate having a silicon-containing film on a surface of the substrate into a processing container;

a first step of forming an adsorption layer by supplying an oxygen-containing gas into the processing container and causing the oxygen-containing gas to be adsorbed on a surface of the silicon-containing film without oxidizing the surface of the silicon-containing film;

a second step of forming a silicon oxide layer by supplying an argon-containing gas into the processing container and causing the adsorption layer and the surface of the silicon-containing film to react with each other with plasma of the argon-containing gas; and a third step of forming a graphene film on the silicon oxide layer by supplying a carbon-containing gas into the processing container with plasma of the carbon-containing gas, wherein the first step is performed in a state in which plasma generation is stopped, and a substrate support pin of a stage is raised and the carried-in substrate is held at a first position, and the second step and the third step are executed in a state in which the substrate support pin is lowered and the substrate is held at a second position.

2. The substrate processing method of claim 1, wherein the first position is a position where the substrate is supported above the stage, and the second position is a position where the substrate is placed on the stage.

3. The substrate processing method of claim 2, wherein the first position is a position of 10 mm to 15 mm from a top surface of the stage.

4. The substrate processing method of claim 3, wherein, in the first step, after the adsorption layer is formed, the supply of the oxygen-containing gas is stopped and an interior of the processing container is evacuated.

5. The substrate processing method of claim 4, further comprising:

a fourth step of etching an oxide formed on the surface of the silicon-containing film, prior to the first step.

6. The substrate processing method of claim 5, wherein, in the fourth step, the oxide is etched by processing with plasma of a mixed gas including a hydrogen-containing gas.

7. The substrate processing method of claim 6, further comprising:

a fifth step of modifying a surface of the silicon oxide layer with plasma of a mixed gas including the argon-containing gas and the carbon-containing gas, prior to the third step.

8. The substrate processing method of claim 7, wherein the first step is executed at a first temperature, and the second step and the third step are executed at a second temperature higher than the first temperature.

9. The substrate processing method of claim 8, wherein the first temperature is a temperature of 250 degrees C. or lower, and the second temperature is a temperature of 400 degrees C. or higher.

10. The substrate processing method of claim 9, further comprising:

a pre-step of performing plasma processing in a state in which the substrate is not present in the processing container, prior to the carry-in step, wherein the pre-step includes a degassing step of drawing out and removing oxygen in the processing container by using plasma of the hydrogen-containing gas.

11. The substrate processing method of claim 1, wherein the first position is a position of 10 mm to 15 mm from a top surface of the stage.

12. The substrate processing method of claim 1, wherein, in the first step, after the adsorption layer is formed, the supply of the oxygen-containing gas is stopped and an interior of the processing container is evacuated.

13. The substrate processing method of claim 1, further comprising:

a fourth step of etching an oxide formed on the surface of the silicon-containing film, prior to the first step.

14. The substrate processing method of claim 1, further comprising:

a fifth step of modifying a surface of the silicon oxide layer with plasma of a mixed gas including the argon-containing gas and the carbon-containing gas, prior to the third step.

15. The substrate processing method of claim 1, wherein the first step is executed at a first temperature, and the second step and the third step are executed at a second temperature higher than the first temperature.

16. The substrate processing method of claim 1, further comprising:

a pre-step of performing plasma processing in a state in which the substrate is not present in the processing container, prior to the carry-in step, wherein the pre-step includes a degassing step of drawing out and removing oxygen in the processing container by using plasma of a hydrogen-containing gas.

* * * * *